United States Patent
Yasuda et al.

(10) Patent No.: US 10,329,193 B2
(45) Date of Patent: Jun. 25, 2019

(54) METHOD FOR PRODUCING TOUGHENED GLASS PLATE

(71) Applicant: Nippon Electric Glass Co., Ltd., Shiga (JP)

(72) Inventors: Hiroyuki Yasuda, Shiga (JP); Kozo Kobayashi, Shiga (JP); Takuji Oka, Shiga (JP); Naoki Toyofuku, Shiga (JP); Shigeru Sera, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 612 days.

(21) Appl. No.: 14/892,363

(22) PCT Filed: May 22, 2014

(86) PCT No.: PCT/JP2014/063615
§ 371 (c)(1),
(2) Date: Nov. 19, 2015

(87) PCT Pub. No.: WO2014/189118
PCT Pub. Date: Nov. 27, 2014

(65) Prior Publication Data
US 2016/0102015 A1    Apr. 14, 2016

(30) Foreign Application Priority Data

May 24, 2013   (JP) ................................ 2013-109800

(51) Int. Cl.
| | |
|---|---|
| *C03C 21/00* | (2006.01) |
| *H05K 5/03* | (2006.01) |
| *C03B 29/02* | (2006.01) |
| *C03B 33/02* | (2006.01) |
| *C03C 3/091* | (2006.01) |
| *C03C 3/093* | (2006.01) |
| *C03C 3/087* | (2006.01) |
| *C03C 23/00* | (2006.01) |

(52) U.S. Cl.
CPC .......... *C03C 21/002* (2013.01); *C03B 29/025* (2013.01); *C03B 33/02* (2013.01); *C03C 3/087* (2013.01); *C03C 3/091* (2013.01); *C03C 3/093* (2013.01); *C03C 23/007* (2013.01); *H05K 5/03* (2013.01)

(58) Field of Classification Search
CPC ... C03C 21/002; C03C 23/007; C03C 25/602; H05K 5/03; C03B 33/02
See application file for complete search history.

(56) References Cited

U.S. PATENT DOCUMENTS

| | | | | | |
|---|---|---|---|---|---|
| 4,119,760 | A | * | 10/1978 | Rinehart | ................. C03C 3/085 428/218 |
| 4,671,814 | A | * | 6/1987 | Aratani | ................... C03C 21/00 428/410 |
| 2006/0063009 | A1 | | 3/2006 | Naitou et al. | |
| 2009/0325776 | A1 | | 12/2009 | Murata | |
| 2011/0091704 | A1 | | 4/2011 | Akiba et al. | |
| 2011/0294649 | A1 | * | 12/2011 | Gomez | ................. C03C 21/001 501/66 |
| 2012/0134025 | A1 | * | 5/2012 | Hart | ........................ C03C 15/00 359/601 |
| 2012/0196110 | A1 | * | 8/2012 | Murata | ................... C03B 25/08 428/220 |
| 2014/0370264 | A1 | | 12/2014 | Ohara et al. | |

FOREIGN PATENT DOCUMENTS

| | | | | |
|---|---|---|---|---|
| CN | 102344241 | | 2/2012 | |
| JP | 2006-83045 | | 3/2006 | |
| JP | 2008-195602 | | 8/2008 | |
| JP | 2008195602 A | * | 8/2008 | ........... C03B 17/064 |
| JP | 2011-88763 | | 5/2011 | |
| WO | 2009/157297 | | 12/2009 | |
| WO | 2013/088856 | | 6/2013 | |

OTHER PUBLICATIONS

Translation of Table 1 from JP 2008-195602. (Year: 2008).*
International Search Report dated Aug. 26, 2014 in International (PCT) Application No. PCT/JP2014/063615.
Izumitani et al., "New glass and physical properties thereof", Management System Laboratory, First edition, Aug. 20, 1984, pp. 451-498, with partial English translation.
First Office Action dated Dec. 19, 2016 in corresponding Chinese Application No. 201480022696.6, with partial English translation.
International Preliminary Report on Patentability dated Nov. 24, 2015 in corresponding International (PCT) Application No. PCT/JP2014/063615.

* cited by examiner

*Primary Examiner* — Kara B Boyle
(74) *Attorney, Agent, or Firm* — Wenderoth, Lind & Ponack, L.L.P.

(57) ABSTRACT

A method of manufacturing a tempered glass sheet of the present invention includes: subjecting a glass sheet to be tempered having a sheet thickness of 2.0 mm or less to ion exchange treatment; and performing heat treatment at a temperature of 50° C. or more and less than a strain point of the glass sheet to be tempered.

14 Claims, 6 Drawing Sheets

METHOD FOR PRODUCING TOUGHENED GLASS PLATE

TECHNICAL FIELD

The present invention relates to a method of manufacturing a tempered glass sheet, and more particularly, to a method of manufacturing a tempered glass sheet suitable for a cover glass of a display device, such as a cellular phone, a digital camera, or a personal digital assistant (PDA).

BACKGROUND ART

Display devices, such as a cellular phone, a digital camera, a PDA, a touch panel display, and a large-screen television, show a tendency of further prevalence.

Hitherto, in those applications, a resin sheet, such as an acrylic sheet, has been used as a protective member for protecting a display. However, owing to a low Young's modulus of the resin sheet, the resin sheet is liable to bend when a display surface of the display is pushed with a pen, a human finger, or the like. Therefore, the resin sheet causes a display failure through its contact with an internal display in some cases. The resin sheet also involves a problem of being liable to have flaws on its surfaces, resulting in easy reduction of visibility. A solution to those problems is to use a glass sheet as the protective member. The glass sheet for this application is required to, for example, (1) have a high mechanical strength, (2) have a low density and a light weight, (3) be able to be supplied at low cost in a large amount, (4) be excellent in bubble quality, (5) have a high light transmittance in a visible region, and (6) have a high Young's modulus so as not to bend easily when its surface is pushed with a pen, a finger, or the like. In particular, a glass sheet which does not satisfy the requirement (1) cannot serve as the protective member, and hence a tempered glass sheet obtained through ion exchange treatment has been used as the protective member heretofore (see Patent Literatures 1 and 2, and Non Patent Literature 1).

Hitherto, the tempered glass sheet has been produced by so-called "pre-tempering cutting", which is a method comprising cutting a glass sheet to be tempered so as to have a predetermined shape in advance and then subjecting the resultant to ion exchange treatment. In recent years, so-called "post-tempering cutting", which is a method comprising subjecting a large glass sheet to be tempered to ion exchange treatment and then cutting the resultant so as to have a predetermined size, has been under consideration. When the post-tempering cutting is performed, there is an advantage in that the manufacturing efficiency of the tempered glass sheet and various devices dramatically improves.

CITATION LIST

Patent Literature

Patent Literature 1: JP 2006-83045 A
Patent Literature 2: JP 2011-88763 A

Non Patent Literature

Non Patent Literature 1: Tetsuro Izumitani et al., "New glass and physical properties thereof," First edition, Management System Laboratory. Co., Ltd., Aug. 20, 1984, p. 451-498

SUMMARY OF INVENTION

Technical Problem

Meanwhile, a float method enables large and thin glass sheets to be mass-produced at low cost, and hence the float method is generally used as a method of forming a glass sheet to be tempered. For example, in Patent Literature 2, there is disclosed a glass sheet to be tempered, which is formed by the float method, comprising as a glass composition, in terms of mol %, 67% to 75% of $SiO_2$, 0% to 4% of $Al_2O_3$, 7% to 15% of $Na_2O$, 1% to 9% of $K_2O$, 6% to 14% of MgO, 0% to 1% of CaO, 0% to 1.5% of $ZrO_2$, 71% to 75% of $SiO_2+Al_2O_3$, and 12% to 20% of $Na_2O+K_2O$ and having a thickness of 1.5 mm or less.

However, when the glass sheet to be tempered, which is formed by the float method, is subjected to ion exchange treatment, there arises a problem in that the properties and composition in the vicinity of a surface vary between a side brought into contact with a tin bath during a glass manufacturing step, what is called a bottom surface, and an opposite side thereof, what is called a top surface, and the tempered glass sheet is warped toward the top surface side in a convex shape. When the warpage level of the tempered glass sheet is large, the yield of the tempered glass sheet decreases.

On the other hand, when a glass sheet to be tempered is formed by a method other than the float method, for example, an overflow down-draw method, the differences in properties and composition between the front surface and the back surface can be reduced, and hence the warpage level caused by the differences can be reduced. However, even in the case where a glass sheet to be tempered is formed by a method other than the float method, when the glass sheet to be tempered is enlarged and/or thinned, a tempered glass sheet may be warped.

This phenomenon is liable to become conspicuous in the case where a thin glass sheet to be tempered is subjected to ion exchange treatment to obtain a tempered glass sheet.

The present invention has been made in view of the above-mentioned circumstances, and an object of the present invention is to provide a method of manufacturing a tempered glass sheet, which is capable of reducing a warpage level to the extent possible even in the case of subjecting a thin glass sheet to be tempered to ion exchange treatment to obtain a tempered glass sheet.

Solution to Problem

The inventors of the present invention have made extensive investigations, and as a result, have found that the above-mentioned object can be achieved by subjecting a thin tempered glass sheet to predetermined heat treatment. The finding is proposed as the present invention. That is, according to one embodiment of the present invention, there is provided a method of manufacturing a tempered glass sheet, comprising: subjecting a glass sheet to be tempered having a sheet thickness of 2.0 mm or less to ion exchange treatment; and performing heat treatment at a temperature of 50° C. or more and less than a strain point of the glass sheet to be tempered. Herein, the "strain point" refers to a value measured based on a method of ASTM C336.

It is known that a glass sheet is not thermally deformed at a temperature equal to or less than its strain point. The inventors of the present invention have made extensive studies, and as a result, have found that, in the case of the tempered glass sheet, the warpage level can be reduced unexpectedly even when the tempered glass sheet is subjected to the heat treatment at a temperature of less than the strain point. The reason that the warpage level can be reduced is not clear and is currently under investigation. The inventors of the present invention presume the following. In the case of the tempered glass sheet, alkali ions, which are immobilized in a state of being segregated in a surface layer portion of a compressive stress layer during the ion exchange treatment, contribute to the warpage. When the tempered glass sheet is subjected to the heat treatment, the movement of the alkali ions proceeds to gradually eliminate the segregated state of the alkali ions, with the result that the warpage level is reduced.

In the method of manufacturing a tempered glass sheet according to the embodiment of the present invention, it is preferred that the heat treatment be performed at a temperature of 80° C. or more and less than (strain point-200° C. With this, the warpage level can be reduced easily, and an ion exchange reaction does not proceed easily due to the heat treatment, with the result that a desired compressive stress is obtained easily.

According to another embodiment of the present invention, there is provided a method of manufacturing a tempered glass sheet of the present invention comprises: subjecting a glass sheet to be tempered having a sheet thickness of 2.0 mm or less to ion exchange treatment through use of an ion exchange solution containing a $KNO_3$ molten salt; and performing heat treatment so that a value of (internal K emission intensity)/(surface layer K emission intensity) becomes from more than 0.67 to 0.95. As described above, it is considered that when the concentration gradient of alkali ions is gentle in a surface layer portion of a compressive stress layer, the alkali ions are less segregated. Thus, it is presumed that, when the value of (internal K emission intensity)/(surface layer K emission intensity) of the tempered glass sheet is controlled to from more than 0.67 to 0.95 by the heat treatment, the movement of the alkali ions proceeds to gradually eliminate the segregated state of the alkali ions, with the result that the warpage level is reduced. It should be noted that the "(internal K emission intensity)/(surface layer K emission intensity)" represents a ratio of the K emission intensity of an inside (for example, the K emission intensity in a region deeper by 10 μm than a depth of stress layer (hereinafter referred to as "depth of layer")) when the reduction in K concentration from a surface to an inside in a depth direction is substantially converged in the case where the K emission intensity on the surface is defined as 1 (in this case, the K emission intensity of a deep portion becomes 0), and can be measured by GD-OES.

In the method of manufacturing a tempered glass sheet according to the embodiment of the present invention, it is preferred that the method of manufacturing a tempered glass sheet further comprise a step of cooling the tempered glass sheet to a temperature of less than 200° C. after the ion exchange treatment and before the heat treatment. With this, the warpage level of the tempered glass sheet can be examined easily after the ion exchange treatment. Therefore, the tempered glass sheet of good quality having a small warpage level can be collected, and only the tempered glass sheet (defective product) having a large warpage level can be subjected to the heat treatment. As a result, the manufacturing efficiency of the tempered glass sheet can be improved.

In the method of manufacturing a tempered glass sheet according to the embodiment of the present invention, it is preferred that the method of manufacturing a tempered glass sheet further comprise a step of cutting the tempered glass sheet to a predetermined size after the heat treatment. With this, the warpage level of the large tempered glass sheet can be reduced, and hence the efficiency of post-tempering cutting is improved easily. As a result, the manufacturing efficiency of the tempered glass sheet can be improved.

In the method of manufacturing a tempered glass sheet according to the embodiment of the present invention, it is preferred that the method of manufacturing a tempered glass sheet further comprise a step of cutting the tempered glass sheet to a predetermined size after the ion exchange treatment and before the heat treatment. The manufacturing efficiency of the tempered glass sheet is improved by post-tempering cutting, and it becomes easy to handle the tempered glass sheet after post-tempering cutting.

In the method of manufacturing a tempered glass sheet according to the embodiment of the present invention, it is preferred that the method of manufacturing a tempered glass sheet further comprise a step of cutting the tempered glass sheet to a predetermined size before the ion exchange treatment. With this, it becomes easy to handle the glass sheet to be tempered (tempered glass sheet).

In the method of manufacturing a tempered glass sheet according to the embodiment of the present invention, it is preferred that the step of subjecting to a glass sheet to be tempered to ion exchange treatment be performed so that a compressive stress of a compressive stress layer of the tempered glass sheet is 400 MPa or more, and a depth of layer of the compressive stress layer is 15 μm or more. Herein, the "compressive stress of a compressive stress layer" and "depth of layer of the compressive stress layer" refer to values calculated on the basis of the number of interference fringes observed when a sample is observed using a surface stress meter (for example, FSM-6000 manufactured by Orihara Industrial Co., Ltd.) and intervals therebetween.

In the method of manufacturing a tempered glass sheet according to the embodiment of the present invention, it is preferred that the glass sheet to be tempered be formed by an overflow down-draw method or a float method. When the glass sheet to be tempered is formed by the overflow down-draw method, a glass sheet having satisfactory surface quality in an unpolished state can be produced easily, and hence the mechanical strength of the surface of a tempered glass sheet can be increased easily. Further, a large and/or thin glass sheet can be produced easily. In addition, the differences in properties and composition in the vicinity of the surface of each of the front surface and the back surface are likely to be reduced, and thus the warpage caused by the differences can be suppressed easily. Herein, the "overflow down-draw method" refers to a method comprising causing a molten glass to overflow from both sides of a heat-resistant trough-shaped structure, and subjecting the overflowing molten glasses to down-draw downward while the molten glasses are joined at the lower end of the trough-shaped structure, to thereby form a glass sheet. On the other hand, when the glass sheet to be tempered is formed by the float method, the large and/or thin glass sheet can be produced at low cost. Then, as described above, when the glass sheet to be tempered is formed by the float method, the tempered glass sheet is liable to be warped in a convex shape on a top surface side, but the warpage can be eliminated to some degree according to the present invention.

In the method of manufacturing a tempered glass sheet according to the embodiment of the present invention, it is preferred that the glass sheet to be tempered be produced so as to comprise 1 mass % to 20 mass % of $Na_2O$ in a glass composition.

In the method of manufacturing a tempered glass sheet according to the embodiment of the present invention, it is preferred that the glass sheet to be tempered be produced so as to comprise as a glass composition, in terms of mass %, 50% to 80% of $SiO_2$, 5% to 25% of $Al_2O_3$, 0% to 15% of $B_2O_3$, 1% to 20% of $Na_2O$, and 0% to 10% of $K_2O$. With this, ion exchange performance and denitrification resistance can both be achieved at high levels.

In the method of manufacturing a tempered glass sheet according to the embodiment of the present invention, it is preferred that the glass sheet to be tempered be produced so as to have a strain point of 500° C. or more. With this, the heat resistance of the tempered glass sheet improves, and hence the warpage level of the tempered glass sheet is less liable to be warped.

In the method of manufacturing a tempered glass sheet according to the embodiment of the present invention, it is preferred that the glass sheet to be tempered be produced so as to have a β-OH value of 0.45/mm or less. As the β-OH value is smaller, the strain point increases more, and the ion exchange performance improves. Herein, the "β-OH value" refers to a value determined with the following expression by measuring a transmittance of a glass through use of FT-IR.

$$\beta\text{-OH value}=(1/X)\log(T_1/T_2)$$

X: Sample thickness (mm)
$T_1$: Transmittance (%) at a reference wavelength of 3,846 $cm^{-1}$
$T_2$: Minimum transmittance (%) around a hydroxy group absorption wavelength of 3,600 $cm^{-1}$ It is preferred that the method of manufacturing a tempered glass sheet according to the embodiment of the present invention be free of polishing a whole or a part of a surface of the tempered glass sheet.

In the method of manufacturing a tempered glass sheet according to the embodiment of the present invention, it is preferred that the tempered glass sheet be used for a cover glass of a display device.

According to still another embodiment of the present invention, there is provided a tempered glass sheet, which has a sheet thickness of less than 0.7 mm and a value of (internal K emission intensity)/(surface layer K emission intensity) of from more than 0.67 to 0.95. As described above, when the glass sheet to be tempered is thinned, the warpage is liable to occur in the tempered glass sheet. Then, when the value of (internal K emission intensity)/(surface layer K emission intensity) is controlled to from more than 0.67 to 0.95, the occurrence of the warpage can be suppressed even in the case where the tempered glass sheet is thinned.

DESCRIPTION OF EMBODIMENTS

In a method of manufacturing a tempered glass sheet of the present invention, a glass sheet to be tempered having a sheet thickness of 2.0 mm or less is subjected to heat treatment after being subjected to ion exchange treatment through use of an ion exchange solution containing a $KNO_3$ molten salt. It is preferred that the heat treatment be performed so that the value of (internal K emission intensity)/(surface layer K emission intensity) becomes from more than 0.67 to 0.95. A lower limit value of the (internal K emission intensity)/(surface layer K emission intensity) is preferably 0.68, 0.70, 0.72, or 0.74, particularly preferably 0.75. Further, an upper limit value of the (internal K emission intensity)/(surface layer K emission intensity) is preferably 0.92, 0.90, or 0.88, particularly preferably 0.86. When the (internal K emission intensity)/(surface layer K emission intensity) is too large, alkali ions are immobilized in a state of being segregated in a surface layer portion of a compressive stress layer, and hence the warpage level of the tempered glass sheet is liable to increase. On the other hand, when the (internal K emission intensity)/(surface layer K emission intensity) is too small, a compressive stress is liable to lower, and it becomes difficult to maintain mechanical strength.

In the method of manufacturing a tempered glass sheet of the present invention, the heat treatment is performed at a temperature of 50° C. or more and less than a strain point of the glass to be tempered, and the heat treatment is performed preferably at a temperature of 80° C. or more and less than (strain point-50° C., a temperature of 80° C. or more and less than (strain point-100° C., a temperature of 100° C. or more and less than (strain point-150° C., or a temperature of 150° C. or more and less than (strain point-200° C., particularly preferably at a temperature of 80° C. or more and (strain point-205)° C. or less. When the heat treatment temperature is too low, the warpage level of the tempered glass sheet is not reduced easily. On the other hand, when the heat treatment temperature is too high, an ion exchange reaction proceeds during the heat treatment, and the compressive stress is liable to lower.

The heat treatment time is preferably from 10 minutes to 24 hours, from 30 minutes to 10 hours, or from 30 minutes to 5 hours, particularly preferably from 45 minutes to 2 hours. When the heat treatment temperature is too short, the warpage level of the tempered glass sheet is not reduced easily. On the other hand, when the heat treatment time is too long, the efficiency of the heat treatment lowers.

The temperature increase rate up to the heat treatment temperature is preferably 1° C./min or more or 3 min/° C. or more, particularly preferably 5 min/° C. or more. Further, simultaneously, the temperature increase rate up to the heat treatment temperature is preferably 1 hour/° C. or less. The temperature may be increased up to the heat treatment temperature by directly loading the tempered glass sheet in an electric furnace held at the heat treatment temperature. When the temperature increase rate is too high, the tempered glass sheet may be broken due to thermal shock. On the other hand, when the temperature increase rate is too low, the efficiency of the heat treatment lowers.

The temperature decrease rate from the heat treatment temperature is preferably 1° C./min or more or 3 min/° C. or more, particularly preferably 5 min/° C. or more. Further, simultaneously, the temperature decrease rate from the heat treatment temperature is preferably 1 hour/° C. or less. The temperature may be decreased from the heat treatment temperature by natural cooling in an electric furnace subjected to the heat treatment. When the temperature decrease rate is too high, the warpage level is not reduced easily, and the tempered glass sheet may be broken due to thermal shock. On the other hand, when the temperature decrease rate is too low, the efficiency of the heat treatment lowers.

The method of manufacturing a tempered glass sheet of the present invention preferably comprises a step of cooling the tempered glass sheet to a temperature of less than 200° C. (preferably a temperature of 150° C. or less, a temperature of 100° C. or less, or a temperature of 80° C. or less, particularly preferably a temperature of 50° C. or less) after the ion exchange treatment and before the heat treatment. The method of manufacturing a tempered glass sheet of the present invention comprises a mode of continuously performing the ion exchange treatment and the heat treatment. However, when the ion exchange treatment and the heat treatment are performed continuously, the tempered glass sheet that is not warped is also subjected to the heat treatment, which may contrarily increase the warpage level of the tempered glass sheet. When the step of temporarily cooling the tempered glass sheet is provided, the tempered glass sheet of good quality having a small warpage level is collected, and only the tempered glass sheet having a large warpage level can be subjected to the heat treatment. As a result, the manufacturing efficiency of the tempered glass sheet can be improved.

Figure 1:
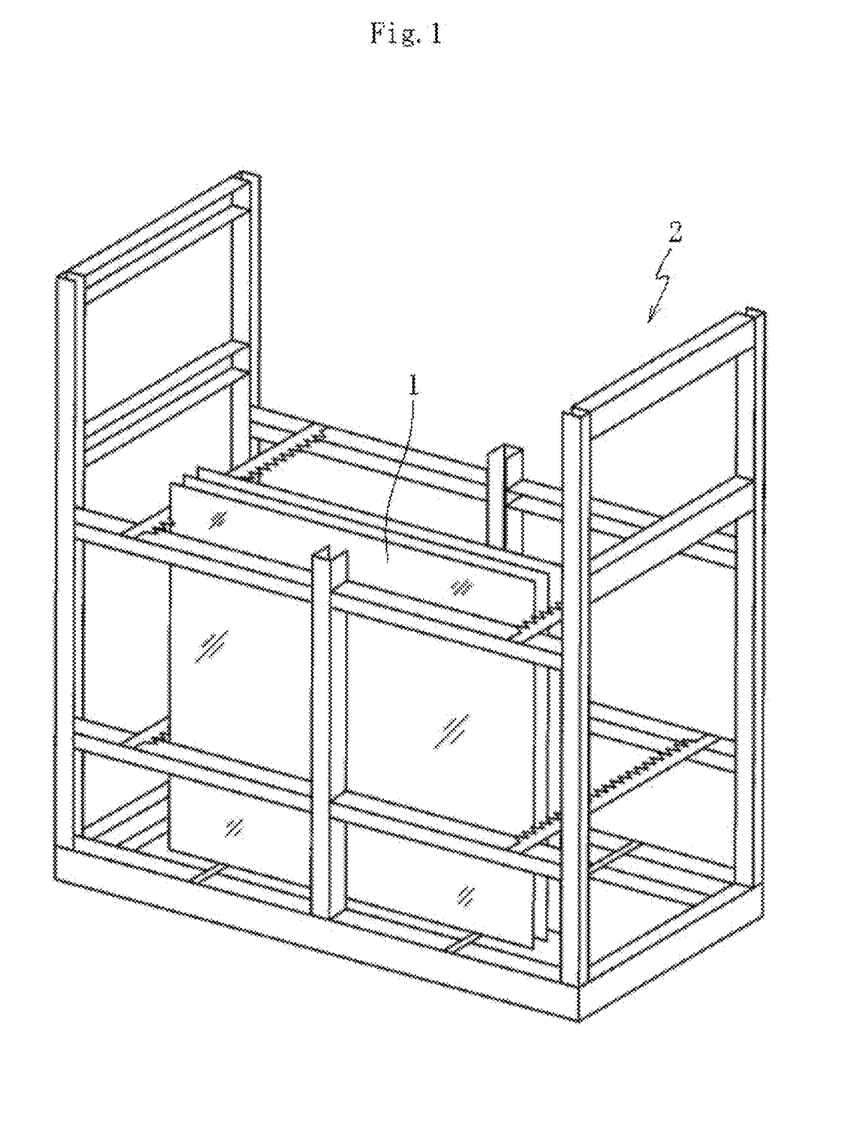
FIG. 1 is a conceptual diagram for illustrating a fixture for arranging a tempered glass sheet in a vertical direction.
Figure 2:
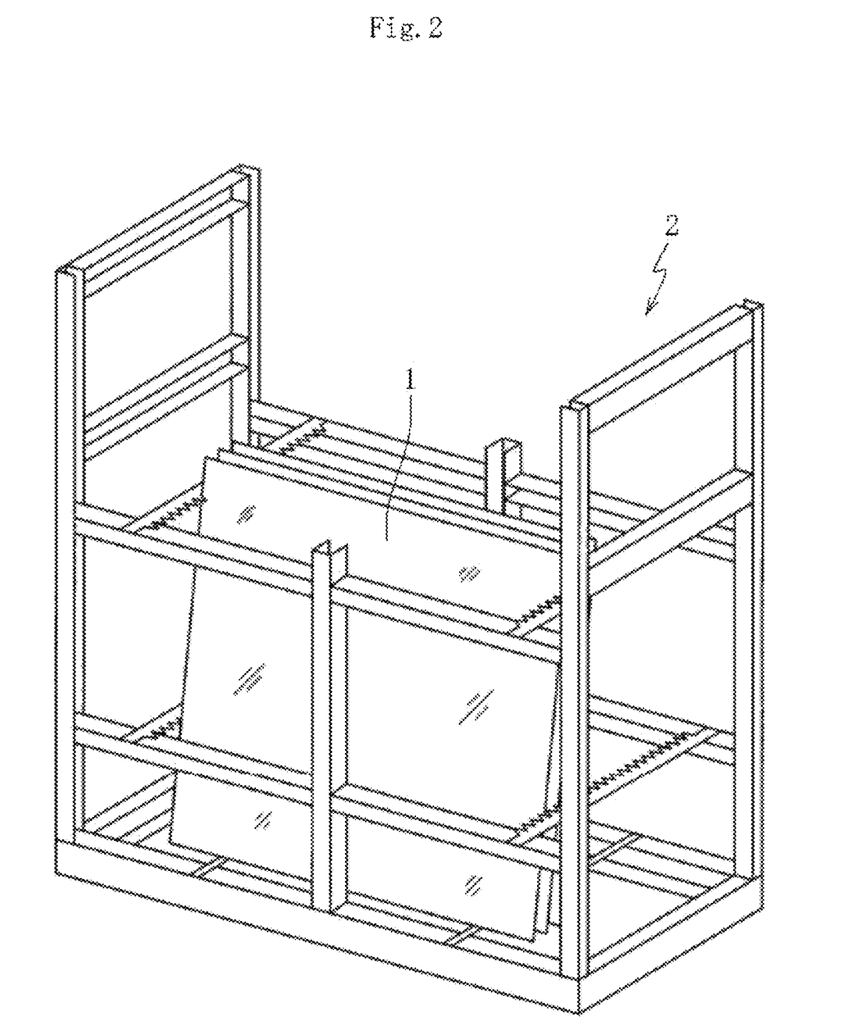
FIG. 2 is a conceptual diagram for illustrating a fixture for arranging the tempered glass sheet in a state of being inclined at about from 10° to 15° from the vertical direction.
Figure 3:
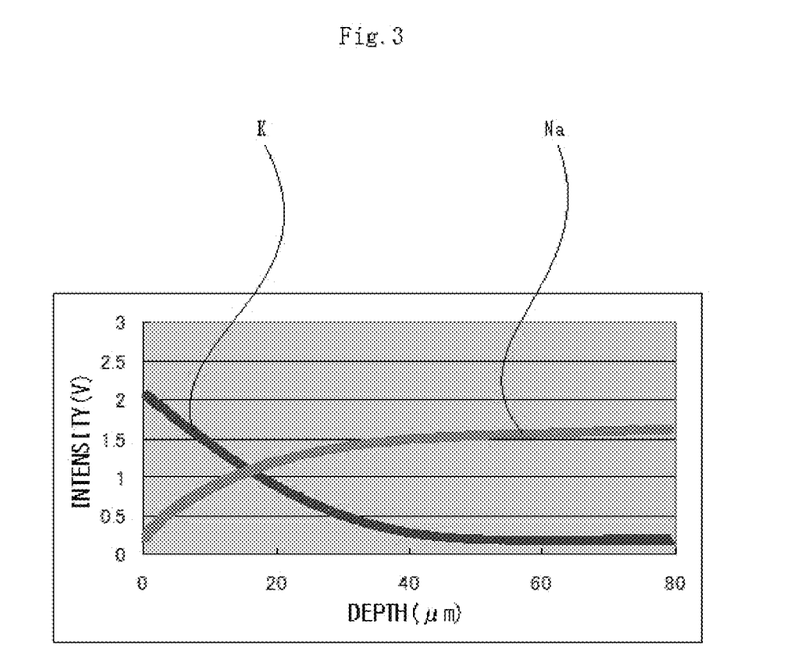
FIG. 3 is a graph for showing data on GD-OES of an alkali component in the vicinity of a surface layer of Sample No. 13 according to [Example 2].
Figure 4:
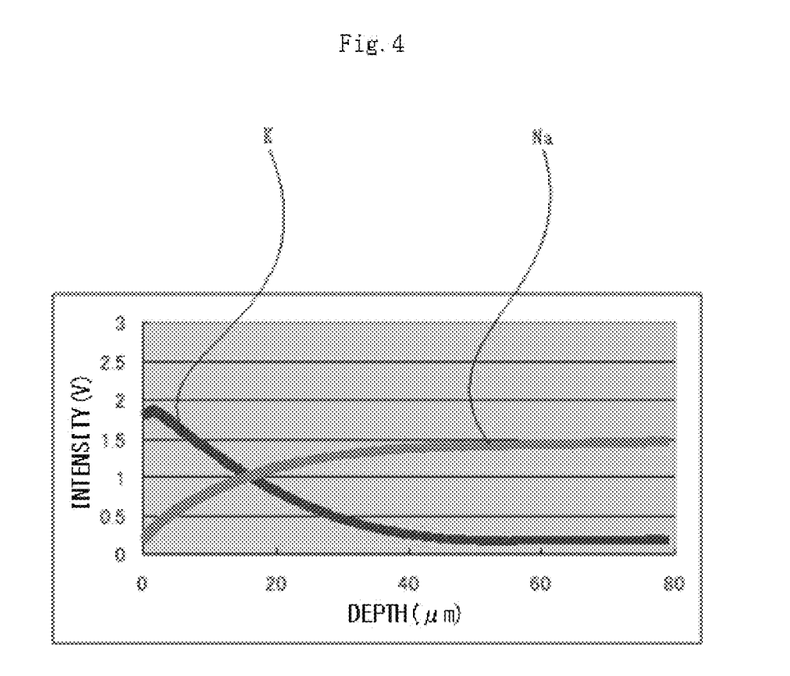
FIG. 4 is a graph for showing data on GD-OES of an alkali component in the vicinity of a surface layer of Sample No. 14 according to [Example 2].
Figure 5:
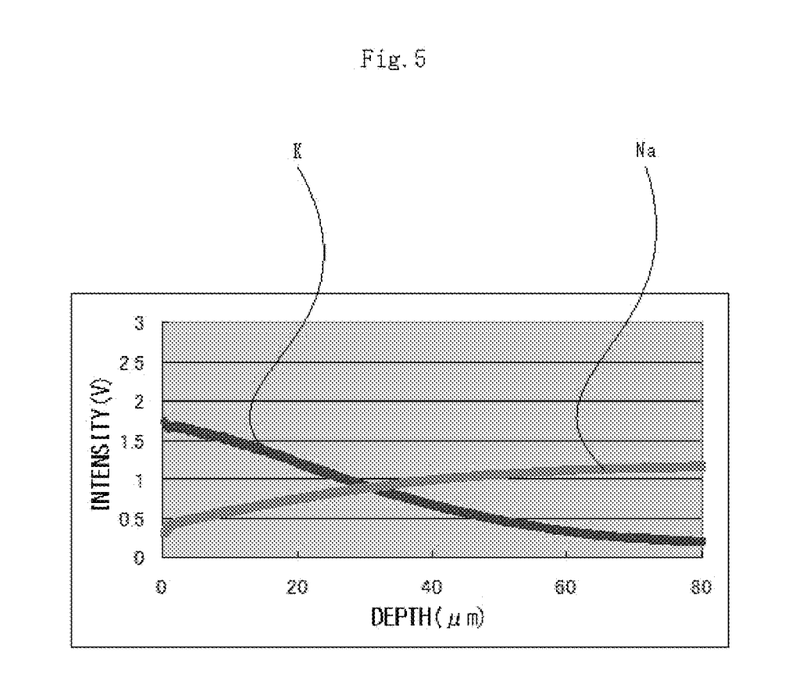
FIG. 5 is a graph for showing data on GD-OES of an alkali component in the vicinity of a surface layer of Sample No. 15 according to [Example 2].
Figure 6:
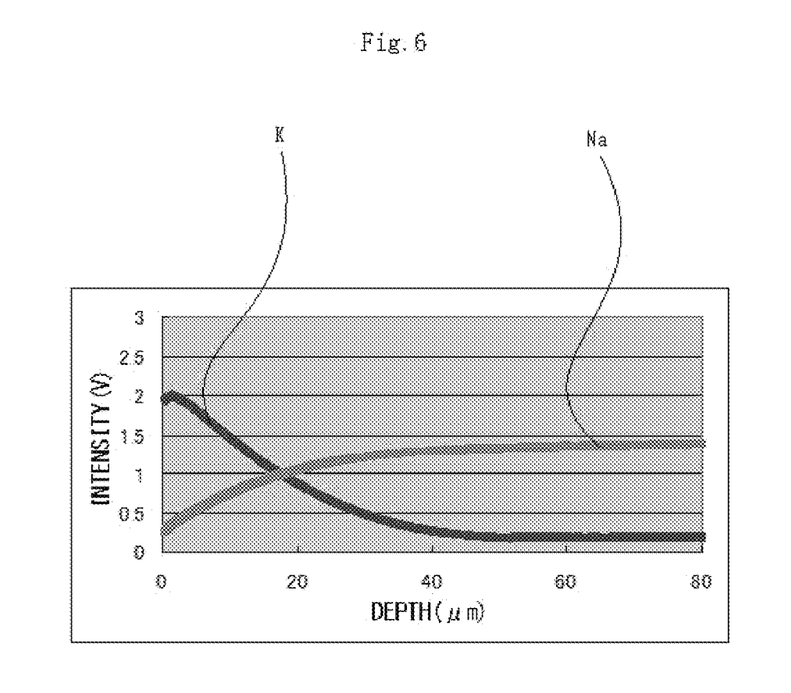
FIG. 6 is a graph for showing data on GD-OES of an alkali component in the vicinity of a surface layer of Sample No. 16 according to [Example 2].
Figure 7:
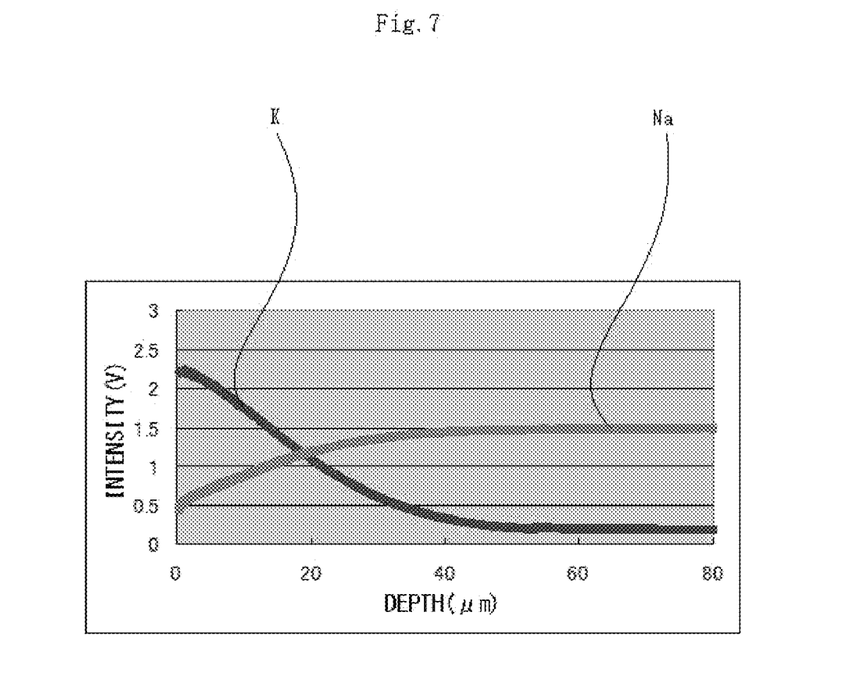
FIG. 7 is a graph for showing data on GD-OES of an alkali component in the vicinity of a surface layer of Sample No. 17 according to [Example 2].
Figure 8:
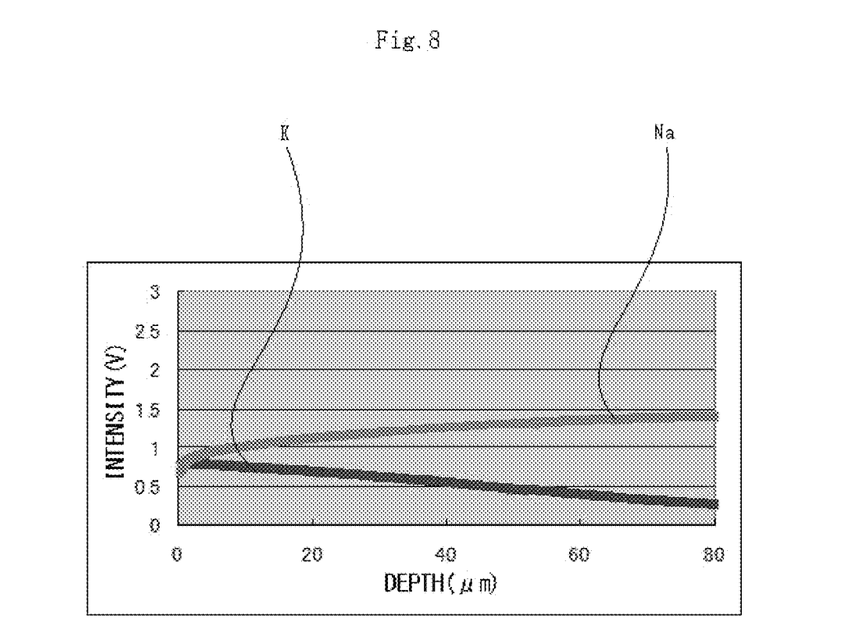
FIG. 8 is a graph for showing data on GD-OES of an alkali component in the vicinity of a surface layer of Sample No. 18 according to [Example 2].
Figure 9:
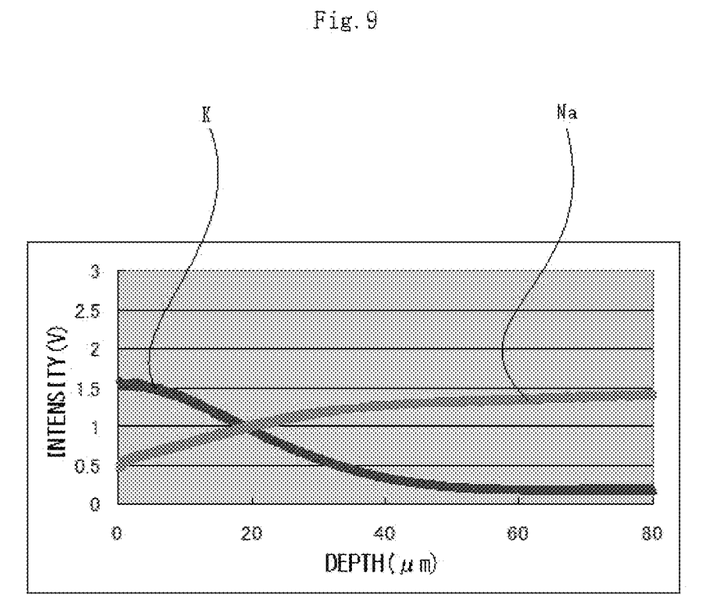
FIG. 9 is a graph for showing data on GD-OES of an alkali component in the vicinity of a surface layer of Sample No. 19 according to [Example 2].
Figure 10:
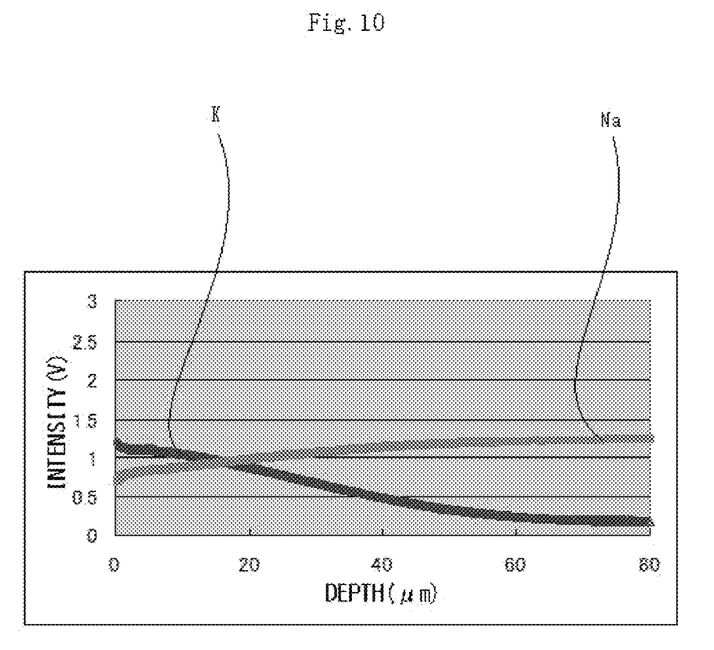
FIG. 10 is a graph for showing data on GD-OES of an alkali component in the vicinity of a surface layer of Sample No. 20 according to [Example 2].

There is no particular limitation on a method of arranging the tempered glass sheet so as to be subjected to the heat treatment. In the case where a plurality of tempered glass sheets are simultaneously subjected to the heat treatment, it is preferred that the tempered glass sheets be arranged in a fixture. As illustrated in FIG. 1 and FIG. 2, as the fixture, a basket 2 for fixing glass sheets 1 to be tempered during the ion exchange treatment may be used. From the viewpoint of reducing the warpage level, the direction of arranging the tempered glass sheets is preferably the vertical direction as illustrated in FIG. 1, but the tempered glass sheets may be inclined at about from 10° to 15° from the vertical direction as illustrated in FIG. 2.

When the plurality of tempered glass sheets are simultaneously subjected to the heat treatment, particularly in the case where an interval between the plurality of tempered glass sheets is narrow (for example, in the case where an interval between the plurality of tempered glass sheets is 10 mm or less, particularly 7 mm or less), it is preferred to decrease temperature while ensuring a soaking property between the tempered glass sheets. In this case, the temperature decrease rate is preferably 15° C./min or less or 10 min/° C. or less, particularly preferably 1 min/° C. to 5 min/° C. Further, from the viewpoint of ensuring the soaking property between the tempered glass sheets, it is also preferred to use air-sending means for sending air to between the tempered glass sheets.

In the method of manufacturing a tempered glass sheet of the present invention, the sheet thickness of the glass sheet to be tempered (tempered glass sheet) is controlled to 2.0 mm or less. The sheet thickness of the glass sheet to be tempered (tempered glass sheet) is controlled to preferably 1.5 mm or less, 1.0 mm or less, 0.8 mm or less, 0.7 mm or less, less than 0.7 mm, or 0.6 mm or less, particularly preferably 0.5 mm or less. With this, the weight of a display device can be reduced easily, and in the case of performing post-tempering cutting, a compressive stress is likely to be generated in a cut surface due to the influence of a compressive stress layer in a surface of the tempered glass sheet, with the result that the mechanical strength of the cut surface is less liable to decrease. On the other hand, when the sheet thickness is too small, desired mechanical strength is not obtained easily. Thus, the sheet thickness is preferably 0.1 mm or more. It should be noted that, as the sheet thickness is smaller, the tempered glass sheet is more liable to be warped, and hence the effect of the present invention can be exhibited more easily.

The sheet area of the glass sheet to be tempered (tempered glass sheet) is controlled to preferably 0.01 $m^2$ or more, 0.1 $m^2$ or more, 0.25 $m^2$ or more, 0.35 $m^2$ or more, 0.45 $m^2$ or more, 0.8 $m^2$ or more, 1.2 $m^2$ or more, 1.5 $m^2$ or more, 2 $m^2$ or more, 1.2.5 $m^2$ or more, 3 $m^2$ or more, 3.5 $m^2$ or more, 4 $m^2$ or more, or 4.5 $m^2$ or more, particularly preferably from 5 $m^2$ to 10 $m^2$. As the sheet area is larger, the number of pieces to be taken from the tempered glass sheet by post-tempering cutting increases more, and the manufacturing efficiency of the tempered glass sheet and various devices dramatically improves. Herein, the "sheet area" refers to the area of a sheet surface excluding an end surface and refers to the area of any one of the front surface or the back surface. It should be noted that, as the sheet area is larger, the tempered glass sheet is more liable to be warped, and hence the effect of the present invention can be exhibited more easily.

In the method of manufacturing a tempered glass sheet of the present invention, it is preferred that the glass sheet to be tempered be formed by an overflow down-draw method. With this, a glass sheet having satisfactory surface quality in an unpolished state can be formed easily, and consequently, the mechanical strength of the surface of the tempered glass sheet can be increased easily. This is because in the case of the overflow down-draw method, a surface which is to serve as a surface of the glass sheet is formed in a state of a free surface without being brought into contact with a trough-shaped refractory. The structure and material of the trough-shaped structure are not particularly limited as long as desired dimensions and surface quality can be achieved. In addition, a method of applying a force to a glass ribbon in order to down-draw the glass ribbon downward is not particularly limited as long as desired dimensions and surface quality can be achieved. For example, there may be adopted a method comprising rotating one or a plurality of pairs of heat-resistant rolls each having a sufficiently large width in the state of being in contact with the glass ribbon, to thereby draw the glass, or there may be adopted a method comprising bringing a plurality of paired heat-resistant rolls into contact with only the vicinity of the end surfaces of the glass ribbon, to thereby draw the glass ribbon.

In the method of manufacturing a tempered glass sheet of the present invention, it is preferred that the glass sheet to be tempered be formed by a float method. With this, the large and/or thin glass sheet can be produced at low cost. Then, as described above, when the glass sheet to be tempered is formed by the float method, the tempered glass sheet is liable to be warped in a convex shape on a top surface side, but the warpage can be eliminated to some degree according to the present invention.

In the method of manufacturing a tempered glass sheet of the present invention, the glass to be tempered may be formed by a method other than the overflow down-draw method or the float method, such as a slot down-draw method, a roll-out method, or a re-draw method.

In the method of manufacturing a tempered glass sheet of the present invention, it is preferred that the glass sheet to be tempered be produced so as to comprise 1 mass % to 20 mass % of $Na_2O$ in its glass composition. $Na_2O$ is a main ion exchange component, and is also a component which lowers the viscosity at high temperature to increase meltability and formability. Further, $Na_2O$ is a component which improves denitrification resistance. However, when the content of $Na_2O$ is too small, the meltability lowers, the thermal expansion coefficient becomes low, and the ion exchange performance is liable to lower. On the other hand, when the content of $Na_2O$ is too large, the thermal expansion coefficient becomes too high, with the result that the thermal shock resistance lowers and it becomes difficult to match the thermal expansion coefficient with those of peripheral materials. Further, in some cases, the strain point excessively lowers, and the glass composition loses its component balance, with the result that the denitrification resistance lowers contrarily.

In the method of manufacturing a tempered glass sheet of the present invention, it is preferred that the glass sheet to be tempered be produced so as to comprise as a glass composition, in terms of mass %, 50% to 80% of $SiO_2$, 5% to 25% of $Al_2O_3$, 0% to 15% of $B_2O_3$, 1% to 20% of $Na_2O$, and 0% to 10% of $K_2O$. The reason why the content range of each component is limited as described above is described below. It should be noted that the expression "%" refers to "mass %" in the following description of the content range of each component.

$SiO_2$ is a component which forms a network of a glass. The content of $SiO_2$ is preferably from 50% to 80%, from 52% to 75%, from 55% to 72%, or from 55% to 70%, particularly preferably from 55% to 67.5%. When the content of $SiO_2$ is too small, vitrification does not occur easily. Further, the thermal expansion coefficient becomes too high, and the thermal shock resistance is liable to lower. On the other hand, when the content of $SiO_2$ is too large, the meltability and formability are liable to lower.

$Al_2O_3$ is a component which increases the ion exchange performance, and is also a component which increases the strain point and a Young's modulus. The content of $Al_2O_3$ is preferably from 5% to 25%. When the content of $Al_2O_3$ is too small, the thermal expansion coefficient becomes too high, and the thermal shock resistance is liable to lower. In addition, sufficient ion exchange performance may not be exhibited. Thus, the content of $Al_2O_3$ is preferably 7% or more, 8% or more, 10% or more, 12% or more, 14% or more, or 15% or more, particularly preferably 16% or more. On the other hand, when the content of $Al_2O_3$ is too large, a devitrified crystal is liable to deposit in the glass and it becomes difficult to form a glass sheet by the overflow down-draw method, or the like. Further, the thermal expansion coefficient becomes too low, with the result that it becomes difficult to match the thermal expansion coefficient with those of peripheral materials. In addition, the viscosity at high temperature rises, and the meltability is liable to lower. Thus, the content of $Al_2O_3$ is preferably 22% or less, 20% or less, 19% or less, or 18% or less, particularly preferably 17% or less. It should be noted that, in the case where the ion exchange performance is considered to be important, it is preferred to increase the content of $Al_2O_3$ to the extent possible, and for example, the content of $Al_2O_3$ is set to preferably 17% or more, 18% or more, 19% or more, or 20% or more, particularly preferably 21% or more.

$B_2O_3$ is a component which lowers the viscosity at high temperature and the density, and stabilizes a glass to make it difficult for a crystal to deposit and lowers the liquidus temperature. Further, $B_2O_3$ is a component which increases crack resistance. However, when the content of $B_2O_3$ is too large, there are tendencies that the coloring of a surface called weathering occurs due to ion exchange treatment, water resistance lowers, the compressive stress of the compressive stress layer lowers, and the depth of layer of the compressive stress layer lowers. Thus, the content of $B_2O_3$ is preferably from 0% to 15%, from 0.1% to 12%, from 1% to 10%, from more than 1% to 8%, or from 1.5% to 6%, particularly preferably from 2% to 5%. It should be noted that in the case where the ion exchange performance is considered to be important, it is preferred to increase the content of $B_2O_3$ to the extent possible, and for example, the content of $B_2O_3$ is set to preferably 2.5% or more, 3% or more, 3.5% or more, or 4% or more, particularly preferably 4.5% or more.

$Na_2O$ is a main ion exchange component, and is also a component which lowers the viscosity at high temperature to increase the meltability and the formability. Further, $Na_2O$ is also a component which improves denitrification resistance. The content of $Na_2O$ is preferably from 1% to 20%. When the content of $Na_2O$ is too small, the meltability lowers, the thermal expansion coefficient becomes low, and the ion exchange performance is liable to lower. Thus, in the case of introducing $Na_2O$, the content of $Na_2O$ is preferably 10% or more, or 11% or more, particularly preferably 12% or more. On the other hand, when the content of $Na_2O$ is too large, the thermal expansion coefficient becomes too high, with the result that the thermal shock resistance lowers and it becomes difficult to match the thermal expansion coefficient with those of peripheral materials. Further, in some cases, the strain point excessively lowers, and the glass composition loses its component balance, with the result that the devitrification resistance lowers contrarily. Thus, the content of $Na_2O$ is preferably 17% or less, particularly preferably 16% or less.

$K_2O$ is a component which promotes ion exchange, and has a high effect of increasing the depth of layer of the compressive stress layer among alkali metal oxides. Further, $K_2O$ is a component which lowers the viscosity at high temperature to increase the meltability and the formability. Further, $K_2O$ is also a component which improves the devitrification resistance. The content of $K_2O$ is from 0% to 10%. When the content of $K_2O$ is too large, the thermal expansion coefficient becomes too high, with the result that the thermal shock resistance lowers and it becomes difficult to match the thermal expansion coefficient with those of peripheral materials. Further, there are tendencies that the strain point excessively lowers, and the glass composition loses its component balance, with the result that the devitrification resistance lowers contrarily. Therefore, the content of $K_2O$ is preferably 8% or less, 6% or less, or 4% or less, particularly preferably less than 2%.

In addition to the components described above, for example, the following components may be added.

Li$_2$O is an ion exchange component, and is also a component which lowers the viscosity at high temperature to increase the meltability and the formability. Further, Li$_2$O is a component which increases the Young's modulus. Further, Li$_2$O has a high effect of increasing the compressive stress among alkali metal oxides. However, when the content of Li$_2$O is too large, the liquidus viscosity lowers and the glass is liable to be devitrified. Further, the thermal expansion coefficient becomes too high, with the result that the thermal shock resistance lowers and it becomes difficult to match the thermal expansion coefficient with those of peripheral materials. Further, when the viscosity at low temperature excessively lowers and stress relaxation easily occurs, the compressive stress may lower contrarily. Therefore, the content of Li$_2$O is preferably from 0% to 3.5%, from 0% to 2%, from 0% to 1%, or from 0% to 0.5%, particularly preferably from 0.01% to 0.2%

The content of Li$_2$O+Na$_2$O+K$_2$O is preferably from 5% to 25%, from 10% to 22%, or from 15% to 22%, particularly preferably from 17% to 22%. When the content of Li$_2$O+Na$_2$O+K$_2$O is too small, the ion exchange performance and the meltability are liable to lower. On the other hand, when the content of Li$_2$O+Na$_2$O+K$_2$O is too large, the glass is liable to be devitrified. In addition, the thermal expansion coefficient becomes too high, with the result that the thermal shock resistance lowers and it becomes difficult to match the thermal expansion coefficient with those of peripheral materials. Further, the strain point excessively lowers, and a high compressive stress is not obtained easily in some cases. Further, the viscosity around the liquidus temperature lowers, and it becomes difficult to secure a high liquidus viscosity in some cases. It should be noted that "the content of Li$_2$O+Na$_2$O+K$_2$O" is the total content of Li$_2$O, Na$_2$O, and K$_2$O.

MgO is a component which lowers the viscosity at high temperature to increase the meltability and the formability, or to increase the strain point and the Young's modulus, and has a high effect of increasing the ion exchange performance among alkaline earth metal oxides. However, when the content of MgO is too large, the density and the thermal expansion coefficient are liable to increase, and the glass is liable to be devitrified. Thus, the content of MgO is preferably 12% or less, 10% or less, 8% or less, or 5% or less, particularly preferably 4% or less. It should be noted that, in the case where MgO is introduced into the glass composition, the content of MgO is preferably 0.1% or more, 0.5% or more, or 1% or more, particularly preferably 2% or more.

CaO has a high effect of lowering the viscosity at high temperature to increase the meltability and the formability or to increase the strain point and the Young's modulus, without lowering the denitrification resistance as compared to the other components. The content of CaO is preferably from 0% to 10%. However, when the content of CaO is too large, the density and the thermal expansion coefficient increase, the glass composition loses its component balance, with the result that the glass is liable to be devitrified contrarily, and the ion exchange performance is liable to lower. Thus, the content of CaO is preferably from 0% to 5%, from 0.01% to 4%, or from 0.1% to 3%, particularly preferably from 1% to 2.5%.

SrO is a component which lowers the viscosity at high temperature to increase the meltability and the formability, or to increase the strain point and the Young's modulus, without lowering the devitrification resistance. However, when the content of SrO is too large, the density and the thermal expansion coefficient increase, the ion exchange performance lowers, and the glass composition loses its component balance, with the result that the glass is liable to be devitrified contrarily. Thus, the content of SrO is preferably from 0% to 5%, from 0% to 3%, or from 0% to 1%, particularly preferably from 0% to less than 0.1%.

BaO is a component which lowers the viscosity at high temperature to increase the meltability and the formability, or to increase the strain point and the Young's modulus, without lowering the devitrification resistance. However, when the content of BaO is too large, the density and the thermal expansion coefficient increase, the ion exchange performance lowers, and the glass composition loses its component balance, with the result that the glass is liable to be devitrified contrarily. Thus, the content of BaO is preferably from 0% to 5%, from 0% to 3%, or from 0% to 1%, particularly preferably from 0% to less than 0.1%.

ZnO is a component which increases the ion exchange performance, and in particular, is a component which has a high effect of increasing the compressive stress. Further, ZnO is a component which lowers the viscosity at high temperature without lowering the viscosity at low temperature. However, when the content of ZnO is too large, there are tendencies that the glass manifests phase separation, the devitrification resistance lowers, the density increases, and the depth of layer of the compressive stress layer lowers. Thus, the content of ZnO is preferably from 0% to 6%, from 0% to 5%, from 0% to 1%, or from 0% to 0.5%, particularly preferably from 0% to less than 0.1%.

ZrO$_2$ is a component which remarkably increases the ion exchange performance and simultaneously increases the viscosity around the liquidus viscosity and the strain point. However, when the content of ZrO$_2$ is too large, the devitrification resistance may remarkably lower, and the density may excessively increase. Thus, the content of ZrO$_2$ is preferably 10% or less, 8% or less, or 6% or less, particularly preferably 5% or less. It should be noted that, in the case where it is intended to increase the ion exchange performance, it is preferred that ZrO$_2$ be introduced into the glass composition, and in this case, the content of ZrO$_2$ is preferably 0.01% or more, or 0.5% or more, particularly preferably 1% or more.

P$_2$O$_5$ is a component which increases the ion exchange performance, and in particular, is a component which increases the depth of layer of the compressive stress layer. However, when the content of P$_2$O$_5$ is too large, the glass is liable to manifest phase separation. Thus, the content of P$_2$O$_5$ is preferably 10% or less, 8% or less, 6% or less, 4% or less, 2% or less, or 1% or less, particularly preferably less than 0.1%.

As a fining agent, one kind or two or more kinds selected from the group consisting of As$_2$O$_3$, Sb$_2$O$_3$, SnO$_2$, F, Cl, and SO$_3$ (preferably the group consisting of SnO$_2$, Cl, and SO$_3$) may be introduced in an amount of from 0 ppm to 30,000 ppm (3%). From the viewpoint of exhibiting the fining effect reliably, the content of SnO$_2$+SO$_3$+Cl is preferably from 0 ppm to 10,000 ppm, from 50 ppm to 5,000 ppm, from 80 ppm to 4,000 ppm, or from 100 ppm to 3,000 ppm, particularly preferably from 300 ppm to 3,000 ppm. Herein, the "the content of SnO$_2$+SO$_3$+Cl" refers to the total content of SnO$_2$, SO$_3$, and Cl.

The content of SnO$_2$ is preferably from 0 ppm to 10,000 ppm, or from 0 ppm to 7,000 ppm, particularly preferably from 50 ppm to 6,000 ppm. The content of Cl is preferably from 0 ppm to 1,500 ppm, from 0 ppm to 1,200 ppm, from 0 ppm to 800 ppm, or from 0 ppm to 500 ppm, particularly preferably from 50 ppm to 300 ppm. The content of SO$_3$ is preferably from 0 ppm to 1,000 ppm, or from 0 ppm to 800 ppm, particularly preferably from 10 ppm to 500 ppm.

Rare earth oxides, such as $Nd_2O_3$ and $La_2O_3$, are components which increase the Young's modulus, and are also components which can control the color of the glass by being decolored when added with a color serving as a complementary color. However, the cost of the raw material itself is high, and when the rare earth oxides are introduced in large amounts, the denitrification resistance is liable to lower. Therefore, the content of the rare earth oxides is preferably 4% or less, 3% or less, 2% or less, or 1% or less, particularly preferably 0.5% or less.

In the present invention, from the viewpoint of the environment, it is preferred that the contents of $As_2O_3$, F, PbO, and $Bi_2O_3$ be substantially zero. Herein, the "content of $As_2O_3$ is substantially zero" is intended to mean that $As_2O_3$ is not added actively as a glass component but the case of mixing $As_2O_3$ at an impurity level is allowed, and specifically refers to that the content of $As_2O_3$ is less than 500 ppm. The "content of F is substantially zero" is intended to mean that F is not added actively as a glass component but the case of mixing F at an impurity level is allowed, and specifically refers to that the content of F is less than 500 ppm. The "content of PbO is substantially zero" is intended to mean that PbO is not added actively as a glass component but the case of mixing PbO at an impurity level is allowed, and specifically refers to that the content of PbO is less than 500 ppm. The "content of $Bi_2O_3$ is substantially zero" is intended to mean that $Bi_2O_3$ is not added actively as a glass component but the case of mixing $Bi_2O_3$ at an impurity level is allowed, and specifically refers to that the content of $Bi_2O_3$ is less than 500 ppm.

It is preferred that the glass sheet to be tempered to be used in the method of manufacturing a tempered glass sheet of the present invention be produced so as to have the following characteristics.

The density of the glass sheet to be tempered is preferably 2.6 g/cm³ or less, particularly preferably 2.55 g/cm³ or less. As the density becomes smaller, the weight of the tempered glass sheet can be reduced more. It should be noted that the density is easily reduced by increasing the content of $SiO_2$, $B_2O_3$, or $P_2O_5$ in the glass composition or by reducing the content of an alkali metal oxide, an alkaline earth metal oxide, ZnO, $ZrO_2$, or $TiO_2$ in the glass composition. It should be noted that the "density" may be measured by a well-known Archimedes method.

The thermal expansion coefficient of the glass sheet to be tempered is preferably from $80 \times 10^{-7}/°C$. to $120 \times 10^{-7}/°C$., from $85 \times 10^{-7}/°C$. to $110 \times 10^{-7}/°C$., or from $90 \times 10^{-7}/°C$. to $110 \times 10^{-7}/°C$., particularly preferably from $90 \times 10^{-7}/°C$. to $105 \times 10^{-7}/°C$. When the thermal expansion coefficient is controlled within the above-mentioned ranges, it becomes easy to match the thermal expansion coefficient with those of members made of a metal, an organic adhesive, and the like, and the members made of a metal, an organic adhesive, and the like are easily prevented from being peeled off. Herein, the "thermal expansion coefficient" refers to a value obtained through measurement of an average thermal expansion coefficient in the temperature range of from 30° C. to 380° C. with a dilatometer. It should be noted that the thermal expansion coefficient is easily increased by increasing the content of $SiO_2$, $Al_2O_3$, $B_2O_3$, an alkali metal oxide, or an alkaline earth metal oxide in the glass composition, and in contrast, the thermal expansion coefficient is easily decreased by reducing the content of the alkali metal oxide or the alkaline earth metal oxide.

The strain point of the glass sheet to be tempered is preferably 500° C. or more, 520° C. or more, or 530° C. or more, particularly preferably 550° C. or more. As the strain point becomes higher, the heat resistance is improved more, and the tempered glass sheet is less liable to be warped. Further, a high-quality film can be easily formed in patterning to form a touch panel sensor or the like. It should be noted that the strain point is easily increased by increasing the content of an alkaline earth metal oxide, $Al_2O_3$, $ZrO_2$, or $P_2O_5$ in the glass composition or by reducing the content of an alkali metal oxide in the glass composition.

The temperature at $10^{4.0}$ dPa·s of the glass sheet to be tempered is preferably 1,280° C. or less, 1,230° C. or less, 1,200° C. or less, or 1,180° C. or less, particularly preferably 1,160° C. or less. Herein, the "temperature at $10^{4.0}$ dPa·s" refers to a value obtained through measurement using a platinum sphere pull up method. As the temperature at $10^{4.0}$ dPa·s becomes lower, a burden on forming equipment is reduced more, the forming equipment has a longer life, and consequently, the manufacturing cost of the glass sheet to be tempered is more easily reduced. It should be noted that the temperature at $10^{4.0}$ dPa·s is easily decreased by increasing the content of an alkali metal oxide, an alkaline earth metal oxide, ZnO, $B_2O_3$, or $TiO_2$ or by reducing the content of $SiO_2$ or $Al_2O_3$.

The temperature at $10^{2.5}$ dPa·s of the glass sheet to be tempered is preferably 1,620° C. or less, 1,550° C. or less, 1,530° C. or less, or 1,500° C. or less, particularly preferably 1,450° C. or less. Herein, the "temperature at $10^{2.5}$ dPa·s" refers to a value obtained through measurement using a platinum sphere pull up method. As the temperature at $10^{2.5}$ dPa·s becomes lower, melting at lower temperature can be carried out, and hence a burden on glass manufacturing equipment, such as a melting furnace, is reduced more, and bubble quality is easily improved more. Thus, as the temperature at $10^{2.5}$ dPa·s becomes lower, the manufacturing cost of the glass sheet to be tempered is more easily reduced. It should be noted that the temperature at $10^{2.5}$ dPa·s corresponds to a melting temperature. Further, the temperature at $10^{2.5}$ dPa·s is easily decreased by increasing the content of an alkali metal oxide, an alkaline earth metal oxide, ZnO, $B_2O_3$, or $TiO_2$ in the glass composition or by reducing the content of $SiO_2$ or $Al_2O_3$ in the glass composition.

The liquidus temperature of the glass sheet to be tempered is preferably 1,200° C. or less, 1,150° C. or less, 1,100° C. or less, 1,050° C. or less, 1,000° C. or less, 950° C. or less, or 900° C. or less, particularly preferably 880° C. or less. Herein, the "liquidus temperature" refers to a temperature at which crystals deposit when glass powder which has passed through a standard 30-mesh sieve (sieve opening: 500 μm) and remained on a 50-mesh sieve (sieve opening: 300 μm) is placed in a platinum boat and kept in a gradient heating furnace for 24 hours. It should be noted that as the liquidus temperature becomes lower, the devitrification resistance and the formability are improved more. Further, the liquidus temperature is easily decreased by increasing the content of $Na_2O$, $K_2O$, or $B_2O_3$ in the glass composition or by reducing the content of $Al_2O_3$, $Li_2O$, MgO, ZnO, $TiO_2$, or $ZrO_2$ in the glass composition.

The liquidus viscosity of the glass sheet to be tempered is preferably $10^{4.0}$ dPa·s or more, $10^{4.4}$ dPa·s or more, $10^{4.8}$ dPa·s or more, $10^{5.0}$ dPa·s or more, $10^{5.4}$ dPa·s or more, $10^{5.6}$ dPa·s or more, $10^{6.0}$ dPa·s or more, or $10^{6.2}$ dPa·s or more, particularly preferably $10^{6.3}$ dPa·s or more. Herein, the "liquidus viscosity" refers to a value obtained through measurement of a viscosity at the liquidus temperature by a platinum sphere pull up method. It should be noted that as the liquidus viscosity becomes higher, the devitrification resistance and the formability are improved more. Further, the liquidus viscosity is easily increased by increasing the content of $Na_2O$ or $K_2O$ in the glass composition or by reducing the content of $Al_2O_3$, $Li_2O$, MgO, ZnO, $TiO_2$, or $ZrO_2$ in the glass composition.

The β-OH value of the glass sheet to be tempered is preferably 0.45 $mm^{-1}$ or less, 0.4 $mm^{-1}$ or less, 0.3 $mm^{-1}$ or less, 0.28 $mm^{-1}$ or less, or 0.25 $mm^{-1}$ or less, particularly preferably from 0.10 $mm^{-1}$ to 0.22 $mm^{-1}$. As the β-OH value is smaller, the strain point increases, and the ion exchange performance improves.

As a method of decreasing the β-OH value, for example, there are given the following methods (1) to (7). (1) A raw material having a low water content is selected. (2) Water is not added to a raw material. (3) The addition amount of components (such as Cl and $SO_3$) for reducing a water content is increased. (4) The water content in an atmosphere in a furnace is reduced. (5) $N_2$ bubbling is performed in molten glass. (6) A small melting furnace is adopted. (7) The flow rate of molten glass is increased.

The method of manufacturing a tempered glass sheet of the present invention preferably does not comprise polishing a part or a whole of the surface of the tempered glass sheet, and particularly preferably does not comprise polishing the whole of the surface of the tempered glass sheet. In addition, the average surface roughness (Ra) of the unpolished surface of the tempered glass sheet is controlled to preferably 10 Å or less, 5 Å or less, 4 Å or less, or 3 Å or less, particularly preferably 2 Å or less. It should be noted that the average surface roughness (Ra) may be measured by a method in conformity with SEMI D7-97 "FPD Glass Substrate Surface Roughness Measurement Method." Glass originally has extremely high theoretical strength, but often breaks even under a stress far lower than the theoretical strength. This is because a small flaw called a Griffith flaw is generated in a glass surface in a step after forming, such as a polishing step. Therefore, when the surface of the tempered glass sheet is left unpolished, the mechanical strength of the tempered glass sheet is maintained after the ion exchange treatment and the tempered glass sheet hardly undergoes breakage. In addition, in the case of performing scribe cutting after the ion exchange treatment, when the surface is left unpolished, an improper crack, breakage, or the like is hardly generated at the time of the scribe cutting. Further, when the surface of the tempered glass sheet is left unpolished, the polishing step can be omitted, and hence the manufacturing cost of the tempered glass sheet can be reduced. It should be noted that in order to obtain the unpolished surface, it is recommended to form the glass sheet to be tempered by an overflow down-draw method.

In the method of manufacturing a tempered glass sheet of the present invention, the compressive stress layer is formed on the surface by the ion exchange treatment. The ion exchange treatment is a method comprising introducing alkali ions having a large ionic radius into a glass surface at a temperature equal to or less than the strain point of the glass sheet to be tempered. When the compressive stress layer is formed by the ion exchange treatment, even in the case where the sheet thickness is small, the compressive stress layer can be formed properly.

Anion exchange solution, anion exchange temperature, and an ion exchange time may be determined in consideration of, for example, the viscosity characteristics of the glass. In particular, when the Na component in the glass sheet to be tempered is exchanged with K ions in the $KNO_3$ molten salt through the ion exchange treatment with K ions in the $KNO_3$ molten salt, the compressive stress layer can be formed efficiently on the surface.

In the method of manufacturing a tempered glass sheet of the present invention, it is preferred that the glass sheet to be tempered be subjected to the ion exchange treatment so that the compressive stress of the compressive stress layer becomes 400 MPa or more (preferably 500 MPa or more, 600 MPa or more, or 650 MPa or more, particularly preferably 700 MPa or more), and the depth of layer of the compressive stress layer becomes 15 µm or more (preferably 20 µm or more, 25 µm or more, or 30 µm or more, particularly preferably 35 µm or more). As the compressive stress is larger, the mechanical strength of the tempered glass sheet increases more. On the other hand, when the compressive stress is too large, it becomes difficult to subject the tempered glass sheet to scribe cutting. Thus, the compressive stress of the compressive stress layer is preferably 1,500 MPa or less, or 1,200 MPa or less, particularly preferably 1,000 MPa or less. It should be noted that, when the content of $Al_2O_3$, $TiO_2$, $ZrO_2$, MgO, or ZnO is increased in the glass composition, or the content of SrO or BaO is reduced in the glass composition, the compressive stress tends to increase. Further, when the ion exchange time is shortened, or the temperature of the ion exchange solution is decreased, the compressive stress tends to increase.

As the depth of layer is larger, the tempered glass sheet is less liable to be cracked even when the tempered glass sheet has a deep flaw, and a variation in mechanical strength decreases more. The depth of layer is preferably 10 µm or more, 20 µm or more, or 30 µm or more, particularly preferably 40 µm or more. On the other hand, when the depth of layer is too large, it becomes difficult to subject the tempered glass sheet to scribe cutting. The depth of layer is preferably 100 µm or less, less than 80 µm, or 60 µm or less, particularly preferably less than 50 µm. It should be noted that, when the content of $K_2O$ or $P_2O_5$ is increased in the glass composition, or the content of SrO or BaO is reduced in the glass composition, the depth of layer tends to increase. Further, when the ion exchange time is extended, or the temperature of the ion exchange solution is increased, the depth of layer tends to increase.

In the method of manufacturing a tempered glass sheet of the present invention, there is no particular limitation on when the tempered glass sheet is cut into a predetermined size. The tempered glass sheet may be cut into a predetermined size before the ion exchange treatment, after the ion exchange treatment and before the heat treatment, or after the heat treatment. When the step of cutting the tempered glass sheet into a predetermined size is provided after the heat treatment, the warpage level of the large tempered glass sheet can be reduced, and hence the efficiency of post-tempering cutting is improved easily. As a result, the manufacturing efficiency of the tempered glass sheet can be improved. In addition, when the step of cutting the tempered glass sheet into a predetermined size is provided after the ion exchange treatment and before the heat treatment, the manufacturing efficiency of the tempered glass sheet is improved by post-tempering cutting, and it becomes easy to handle the tempered glass sheet. Further, when the step of cutting the tempered glass sheet into a predetermined size is provided before the ion exchange treatment, it becomes easy to handle the glass sheet to be tempered (tempered glass sheet).

In the method of manufacturing a tempered glass sheet of the present invention, the tempered glass sheet be subjected to preferably post-tempering cutting, particularly preferably post-tempering scribe cutting from the viewpoint of the manufacturing efficiency of the tempered glass sheet. In the case where the tempered glass sheet is subjected to scribe cutting, it is preferred that the depth of ascribe line be larger than a stress thickness, and an internal tensile stress be 100 MPa or less (preferably 80 MPa or less, 70 MPa or less, 60 MPa or less, or 50 MPa or less). Further, it is preferred that scribing be started from an end surface of the tempered glass sheet and be ended in a region which is away from an opposing end surface to an inner side by 5 mm or more. With this, unintended cracks are less liable to occur during the scribing, and the post-tempering scribe cutting can be easily performed properly. Herein, the internal tensile stress is a value calculated by the following expression.

Internal tensile stress=(Compressive stress×Depth of layer)/(Thickness−Depth of layer×2)

In the case where the post-tempering scribe cutting is performed, it is preferred that a scribe line be formed on a surface of the tempered glass sheet, and the tempered glass sheet be divided along the scribe line. With this, unintended cracks are less liable to develop during the cutting. In order to divide the tempered glass sheet along the scribe line, it is important that the tempered glass be not subjected to spontaneous breakage during formation of the scribe line. The spontaneous breakage is a phenomenon in which the tempered glass sheet is spontaneously broken in the case of receiving damage deeper than the depth of layer due to the influences of the compressive stress in the surface of the tempered glass sheet and the internal tensile stress. When the spontaneous breakage of the tempered glass sheet starts during formation of the scribe line, it becomes difficult to perform desired cutting. Therefore, it is preferred that the depth of the scribe line be controlled within 10 times, 5 times, or particularly 3 times as large as the depth of layer.

In the case of performing the post-tempering cutting, it is preferred that a part or a whole of an edge region, in which the end surface (cut surface) and the surface of the tempered glass sheet cross each other, be chamfered, and it is preferred that a part or a whole of the edge region at least on a display side be chamfered. As chamfering processing, R chamfering is preferred, and in this case, R chamfering with a radius of curvature of from 0.05 mm to 0.5 mm is preferred. Further, C chamfering with a radius of curvature of from 0.05 mm to 0.5 mm is also preferred. Further, the surface roughness Ra of a chamfered surface is preferably 1 nm or less, 0.7 nm or less, or 0.5 nm or less, particularly preferably 0.3 nm or less. With this, cracks originated from the edge region can be prevented easily. Herein, the "surface roughness Ra" refers to a value measured by a method in conformity with JIS B0601:2001.

A tempered glass sheet of the present invention has a feature of having a sheet thickness of less than 0.7 mm and a value of (internal K emission intensity)/(surface layer K emission intensity) of from more than 0.67 to 0.95. The technical features (preferred configuration and effects) of the tempered glass sheet of the present invention are similar to those of the method of manufacturing a tempered glass sheet of the present invention. Herein, for convenience, the detailed description of the tempered glass sheet of the present invention is omitted.

Example 1

The present invention is hereinafter described in detail with reference to Examples. It should be noted that the following Examples are merely illustrative. The present invention is by no means limited to the following Examples.

Examples (Sample Nos. 1 to 12) of the present invention are shown in Table 1.

TABLE 1

| Sample | Sheet thickness (mm) | Number of sheets to be treated | Temperature increase | Temperature decrease | Heat treatment temperature | Heat treatment time | Warpage level (%) After tempering treatment | Warpage level (%) After heat treatment | Compressive stress (MPa) After tempering treatment | Compressive stress (MPa) After heat treatment | Depth of layer (μm) After tempering treatment | Depth of layer (μm) After heat treatment |
|---|---|---|---|---|---|---|---|---|---|---|---|---|
| No. 1 | 0.7 | 1 | 5° C./min | Furnace cooling | 410° C. | 1 hour | 0.15 | 0.08 | 695 | 524 | 44 | 51 |
| No. 2 | 0.6 | 1 | 5° C./min | Furnace cooling | 410° C. | 1 hour | 0.15 | −0.05 | 689 | 526 | 43 | 51 |
| No. 3 | 0.6 | 1 | 5° C./min | Furnace cooling | 310° C. | 1 hour | −0.13 | −0.05 | 689 | 675 | 43 | 44 |
| No. 4 | 0.55 | 1 | 5° C./min | Furnace cooling | 310° C. | 1 hour | 0.13 | 0.08 | 727 | 721 | 45 | 44 |
| No. 5 | 0.7 | 24 | 5° C./min | Furnace cooling | 310° C. | 1 hour | 0.14 | 0.07 | 708 | 694 | 45 | 45 |
| No. 6 | 0.7 | 1 | 5° C./min | Furnace cooling | 310° C. | 1 hour | 0.13 | 0.08 | 810 | 774 | 46 | 47 |
| No. 7 | 0.7 | 1 | 5° C./min | Furnace cooling | 310° C. | 1 hour | 0.24 | 0.14 | 630 | 616 | 53 | 54 |
| No. 8 | 0.7 | 24 | 5° C./min | Direct removal | 310° C. | 1 hour | 0.14 | 0.12 | 687 | 678 | 43 | 44 |
| No. 9 | 0.7 | 1 | 5° C./min | Direct removal | 310° C. | 1 hour | −0.13 | −0.05 | 688 | 682 | 43 | 43 |
| No. 10 | 0.7 | 1 | Direct loading | Direct removal | 310° C. | 1 hour | 0.15 | 0.08 | 699 | 694 | 46 | 46 |
| No. 11 | 0.7 | 1 | 5° C./min | Direct removal | 210° C. | 1 hour | 0.15 | 0.11 | 693 | 688 | 43 | 43 |
| No. 12 | 0.7 | 1 | 5° C./min | Direct removal | 100° C. | 1 hour | −0.17 | −0.14 | 695 | 694 | 43 | 43 |

It should be noted that, in order to form the scribe line, it is preferred to use a diamond wheel tip or the like from the viewpoint of workability.

Glass sheets to be tempered were produced as described below. First, glass raw materials were blended to produce a glass batch. Next, the glass batch was loaded into a continuous melting furnace and formed into a sheet shape by an overflow down-draw method or a float method after a fining step, a stirring step, and a supply step. Then, the resultant was cut into a 7-inch size to produce glass sheets to be tempered.

In each of Sample Nos. 1 to 6 and 8 to 12, the glass sheet to be tempered is formed by the overflow down-draw method, and in Sample No. 7, the glass sheet to be tempered is formed by the float method.

In each of Sample Nos. 1 to 5 and 8 to 12, the glass sheet to be tempered comprises as a glass composition, in terms of mass %, 57.4% of $SiO_2$, 13% of $Al_2O_3$, 2% of $B_2O_3$, 2% of MgO, 2% of CaO, 0.1% of $Li_2O$, 14.5% of $Na_2O$, 5% of $K_2O$, and 4% of $ZrO_2$, and has a density of 2.54 g/cm$^3$, a strain point of 517° C., a thermal expansion coefficient of $99.9 \times 10^{-7}$/° C., a temperature at $10^{4.0}$ dPa·s of 1,098° C., a temperature at $10^{2.5}$ dPa·s of 1,392° C., a liquidus temperature of 910° C., and a liquidus viscosity of $10^{5.5}$ dPa·s.

In Sample No. 6, the glass sheet to be tempered comprises as a glass composition, in terms of mass %, 61.4% of $SiO_2$, 18% of $Al_2O_3$, 0.5% of $B_2O_3$, 0.1% of $Li_2O$, 14.5% of $Na_2O$, 2% of $K_2O$, 3% of MgO, 0.1% of BaO, and 0.4% of $SnO_2$, and has a density of 2.45 g/cm$^3$, a strain point of 563° C., a thermal expansion coefficient of $91.3 \times 10^{-7}$/° C., a temperature at $10^{4.0}$ dPa·s of 1,255° C., a temperature at $10^{2.5}$ dPa·s of 1,590° C., a liquidus temperature of 970° C., and a liquidus viscosity of $10^{6.3}$ dPa·s.

In Sample No. 7, the glass sheet to be tempered comprises as a glass composition, in terms of mass %, 58.4% of $SiO_2$, 13% of $Al_2O_3$, 0.1% of $Li_2O$, 14.5% of $Na_2O$, 5.5% of $K_2O$, 2% of MgO, 2% of CaO, and 4.5% of $ZrO_2$, and has a density of 2.54 g/cm$^3$, a strain point of 533° C., a thermal expansion coefficient of $102.2 \times 10^{-7}$/° C., a temperature at $10^{4.0}$ dPa·s of 1,141° C., a temperature at $10^{2.5}$ dPa·s of 1,429° C., a liquidus temperature of 880° C., and a liquidus viscosity of $10^{6.4}$ dPa·s.

It should be noted that Sample Nos. 1 to 6 and 8 to 12 have unpolished surfaces, whereas Sample No. 7 has a polished surface.

Next, the obtained glass sheets to be tempered were subjected to ion exchange treatment by being immersed in a $KNO_3$ molten salt at 440° C. for 6 hours. After that, the surface of each sample was washed to obtain a tempered glass sheet. Then, the compressive stress and depth of layer of a compressive stress layer in the surface were calculated on the basis of the number of interference fringes observed using a surface stress meter (FSM-6000 manufactured by Orihara Industrial Co., Ltd.) and intervals therebetween. In the calculation, the refractive index and optical elastic constant of each of Sample Nos. 1 to 5 and 7 to 12 were defined as 1.52 and 28 [(nm/cm)/MPa], respectively, and the refractive index and optical elastic constant of Sample No. 6 were defined as 1.50 and 29.5 [(nm/cm)/MPa], respectively. Then, the tempered glass sheets were placed in a state of being propped against a wall and scanned with a laser to calculate a ratio of the warpage with respect to the scan width. It should be noted that, as Sample Nos. 5 and 8, 24 glass sheets to be tempered were subjected to ion exchange treatment in a state of being arranged in an upright posture in a fixture as illustrated in FIG. 1 at an interval of 6 mm in a thickness direction. The ratio of the warpage in this case was defined as an average value of the 24 tempered glass sheets.

Further, the obtained tempered glass sheets were subjected to heat treatment shown in Table 1 to produce Sample Nos. 1 to 12. Specifically, Sample Nos. 1 and 2 were obtained by loading the tempered glass sheets in an electric furnace at room temperature, increasing the temperature to 410° C. at a temperature increase rate of 5° C./min, and retaining the tempered glass sheets at 410° C. for 1 hour, and cooling the tempered glass sheets to room temperature by natural cooling (furnace cooling). Sample Nos. 3 to 7 were obtained by loading the tempered glass sheets in the electric furnace at room temperature, increasing the temperature to 310° C. at a temperature increase rate of 5° C./min, retaining the tempered glass sheets at 310° C. for 1 hour, and cooling the tempered glass sheets to room temperature by natural cooling. Sample Nos. 8 and 9 were obtained by loading the tempered glass sheets in the electric furnace at room temperature, increasing the temperature to 310° C. at a temperature increase rate of 5° C./min, retaining the tempered glass sheets at 310° C. for 1 hour, and directly removing the tempered glass sheets from the electric furnace at 310° C. Sample No. 10 was obtained by directly loading the tempered glass sheet in the electric furnace heated to 310° C., retaining the tempered glass sheet at 310° C. for 1 hour, and directly removing the tempered glass sheet from the electric furnace at 310° C. Sample No. 11 was obtained by loading the tempered glass sheet in the electric furnace at room temperature, increasing the temperature to 210° C. at a temperature increase rate of 5° C./min, retaining the tempered glass sheet at 210° C. for 1 hour, and directly removing the tempered glass sheet from the electric furnace at 210° C. Sample No. 12 was obtained by loading the tempered glass sheet in the electric furnace at room temperature, increasing the temperature to 100° C. at a temperature increase rate of 5° C./min, retaining the tempered glass sheet at 100° C. for 1 hour, and directly removing the tempered glass sheet from the electric furnace at 100° C. It should be noted that, as Sample Nos. 5 and 8, 24 tempered glass sheets were subjected to heat treatment in a state of being arranged in an upright posture in the fixture as illustrated in FIG. 1 at an interval of 6 mm in a thickness direction.

After the heat treatment, the compressive stress and depth of layer of the compressive stress layer in the surface were calculated on the basis of the number of interference fringes observed using a surface stress meter (FSM-6000 manufactured by Orihara Industrial Co., Ltd.) and intervals therebetween. In the calculation, the refractive index and optical elastic constant of each of Sample Nos. 1 to 5 and 7 to 12 were defined as 1.52 and [(nm/cm)/MPa], respectively, and the refractive index and optical elastic constant of Sample No. 6 were defined as 1.50 and 29.5 [(nm/cm)/MPa], respectively. Then, Sample Nos. 1 to 12 were placed in a state of being propped against a wall and scanned with a laser to calculate a ratio of the warpage with respect to the scan width. It should be noted that the ratio of the warpage in Sample Nos. 5 and 8 was defined as an average value of the 24 tempered glass sheets.

As is apparent from Table 1, Sample Nos. 1 to 12 were improved in warpage level by the heat treatment.

Further, it is understood from Table 1 that, when the heat treatment temperature is high, although the warpage level is easily improved, the compressive stress of the compressive stress layer lowers, and the depth of layer is liable to increase. Therefore, it is considered that anion exchange reaction is liable to proceed due to the heat treatment.

It should be noted that it is considered that the tendencies exhibited in Table 1 are also obtained in the glass sheets to be tempered (Samples "a" to "e") shown in Table 2 in the same manner.

TABLE 2

|  |  | a | b | c | d | e |
|---|---|---|---|---|---|---|
| Glass composition (mass %) | $SiO_2$ | 66.0 | 58.8 | 61.7 | 61.19 | 62.4 |
|  | $Al_2O_3$ | 14.2 | 21.4 | 19.7 | 16.2 | 12.9 |
|  | $B_2O_3$ | 2.3 | 4.9 | 3.6 | 0.8 | 2.0 |
|  | $Li_2O$ | 0.1 | — | — | — | 0.1 |
|  | $Na_2O$ | 13.4 | 13.1 | 13.2 | 14.1 | 16.0 |
|  | $K_2O$ | 0.6 | — | — | 3.4 | 2.0 |
|  | MgO | 3.0 | 1.5 | 1.5 | 3.6 | — |
|  | CaO | — | — | — | 0.5 | 2.0 |
|  | $ZrO_2$ | — | 0.1 | 0.1 | 0.01 | 2.5 |
|  | $SnO_2$ | 0.4 | 0.2 | 0.2 | 0.2 | 0.1 |

TABLE 3

| Sample | Heat treatment temperature | Heat treatment time | K emission intensity ratio |
|---|---|---|---|
| No. 13 | No heat treatment | | 0.67 |
| No. 14 | 300° C. | 1 hour | 0.71 |
| No. 15 |  | 24 hours | 0.86 |
| No. 16 | 400° C. | 15 minutes | 0.73 |
| No. 17 |  | 1 hour | 0.77 |
| No. 18 |  | 24 hours | 0.92 |
| No. 19 | 500° C. | 15 minutes | 0.85 |
| No. 20 |  | 1 hour | 0.86 |

Example 2

First, glass raw materials were blended to produce a glass batch so as to comprise as a glass composition, in terms of mass %, 61.4% of $SiO_2$, 18% of $Al_2O_3$, 0.5% of $B_2O_3$, 0.1% of $Li_2O$, 14.5% of $Na_2O$, 2% of $K_2O$, 3% of MgO, 0.1% of BaO, and 0.4% of $SnO_2$. Next, the glass batch was loaded into a continuous melting furnace and formed into a sheet shape by an overflow down-draw method after a fining step, a stirring step, and a supply step. Then, the resultant was cut into dimensions of 1,800 mm×1,500 mm×0.5 mm (thickness) to produce glass sheets to be tempered (parent sheets). It should be noted that the glass sheets to be tempered each have a density of 2.45 $g/cm^3$, a strain point of 563° C., a thermal expansion coefficient of $91.3 \times 10^{-7}/°$ C., a temperature at $10^{4.0}$ dPa·s of 1,255° C., a temperature at $10^{2.5}$ dPa·s of 1,590° C., a liquidus temperature of 970° C., and a liquidus viscosity of $10^{6.3}$ dPa·s.

Next, the resultant glass sheets to be tempered (parent sheets) were subjected to ion exchange treatment by being immersed in a $KNO_3$ molten salt at 430° C. for 4 hours. Then, the compressive stress and the depth of layer of the compressive stress layer were calculated by the same method as above, and as a result, the compressive stress and the depth of layer were 900 MPa and 43 μm, respectively. It should be noted that, in the calculation, the refractive index and optical elastic constant of each of samples were defined as 1.50 and 29.5 [(nm/cm)/MPa], respectively.

Further, a scribe line was formed on a surface of the obtained tempered glass sheet, and the tempered glass sheet was bent and split along the scribe line so that the tempered glass sheet was divided into pieces each having a predetermined size of 7-inch size. It should be noted that, in the formation of the scribe line, scribing was performed so as to start from an end surface and end in a region which is away from an opposing end surface to an inner side by 5 mm or more. Further, in the scribe cutting, the depth of the scribe line was set to be larger than the depth of layer.

Further, the obtained tempered glass sheet (each piece) was subjected to heat treatment (temperature increase rate: 5° C./min, temperature decrease rate: furnace cooling) shown in Table 3 to produce Sample Nos. 14 to 20. The heat-treated samples thus obtained were each measured for a value of (internal K emission intensity)/(surface layer K emission intensity) by GD-OES (GD-Profiler 2 manufactured by Horiba, Ltd.). The results are shown in Table 3 and FIG. 3 to FIG. 10. It should be noted that Sample No. 13 is a tempered glass sheet before being subjected to the heat treatment. Further, the measurement conditions were set to a discharge electric power of 80 W and a discharge pressure of 200 Pa.

As is apparent from Table 3 and FIG. 3 to FIG. 10, Sample Nos. 14 to 21 each had a value of (internal K emission intensity)/(surface layer K emission intensity) falling within a range of from more than 0.67 to 0.95, and were proper. On the other hand, Sample No. 13 had a value of (internal K emission intensity)/(surface layer K emission intensity) falling outside of the above-mentioned numerical value range, and was improper.

INDUSTRIAL APPLICABILITY

The tempered glass sheet according to the present invention is suitable for a cover glass of a display device, such as a cellular phone, a digital camera, or a PDA. Further, the tempered glass sheet according to the present invention can be expected to find use in applications requiring high mechanical strength, for example, a window glass, a substrate for a magnetic disk, a substrate for a flat panel display, a cover glass for a solid image pick-up element, and tableware, in addition to the above-mentioned applications.

The invention claimed is:

1. A method of manufacturing a tempered glass sheet, comprising:
   subjecting a glass sheet to be tempered having a sheet thickness of 2.0 mm or less to ion exchange treatment;
   then cooling the glass sheet to be tempered to a temperature of 80° C. or less after the ion exchange treatment;
   then measuring a warpage of the glass sheet to be tempered after the cooling; and
   then performing heat treatment on the glass sheet to be tempered at a temperature of 100° C. or more and less than a strain point of the glass sheet to be tempered after measuring the warpage.

2. The method of manufacturing a tempered glass sheet according to claim 1, wherein
   the ion exchange treatment is performed with use of an ion exchange solution containing a $KNO_3$ molten salt; and
   the heat treatment is performed so that a value of (internal K emission intensity)/(surface layer K emission intensity) becomes from more than 0.67 to 0.95.

3. The method of manufacturing a tempered glass sheet according to claim 1, wherein the heat treatment is performed at a temperature of 100° C. or more and less than (strain point-200°) C.

4. The method of manufacturing a tempered glass sheet according to claim 1, further comprising a step of cutting the tempered glass sheet to a predetermined size after the heat treatment.

5. The method of manufacturing a tempered glass sheet according to claim 1, comprising a step of cutting the tempered glass sheet to a predetermined size after the ion exchange treatment and before the heat treatment.

6. The method of manufacturing a tempered glass sheet according to claim 1, comprising a step of cutting the tempered glass sheet to a predetermined size before the ion exchange treatment.

7. The method of manufacturing a tempered glass sheet according to claim 1, wherein the glass sheet to be tempered is formed by an overflow down-draw method or a float method.

8. The method of manufacturing a tempered glass sheet according to claim 1, wherein the step of subjecting a glass sheet to be tempered to ion exchange treatment is performed so that a compressive stress of a compressive stress layer of the tempered glass sheet is 400 MPa or more, and a depth of layer of the compressive stress layer is 15 µm or more.

9. The method of manufacturing a tempered glass sheet according to claim 1, wherein the glass sheet to be tempered is produced so as to comprise 1 mass % to 20 mass % of $Na_2O$ in a glass composition.

10. The method of manufacturing a tempered glass sheet according to claim 1, wherein the glass sheet to be tempered is produced so as to comprise as a glass composition, in terms of mass %, 50% to 80% of $SiO_2$, 5% to 25% of $Al_2O_3$, 0% to 15% of $B_2O_3$, 1% to 20% of $Na_2O$, and 0% to 10% of $K_2O$.

11. The method of manufacturing a tempered glass sheet according to claim 1, wherein the glass sheet to be tempered is produced so as to have a strain point of 500° C. or more.

12. The method of manufacturing a tempered glass sheet according to claim 1, wherein the glass sheet to be tempered is produced so as to have a β-OH value of 0.45/mm or less.

13. The method of manufacturing a tempered glass sheet according to claim 1, wherein the method is free of polishing a whole or a part of a surface of the tempered glass sheet.

14. The method of manufacturing a tempered glass sheet according to claim 1, wherein the tempered glass sheet is used for a cover glass of a display device.

* * * * *